United States Patent [19]

Temple

[11] 4,430,792
[45] Feb. 14, 1984

[54] MINIMAL MASK PROCESS FOR MANUFACTURING INSULATED-GATE SEMICONDUCTOR DEVICES WITH INTEGRAL SHORTS

[75] Inventor: Victor A. K. Temple, Clifton Park, N.Y.

[73] Assignee: General Electric Company, Schenectady, N.Y.

[21] Appl. No.: 406,738

[22] Filed: Aug. 9, 1982

Related U.S. Application Data

[63] Continuation of Ser. No. 396,226, Jul. 8, 1982, abandoned.

[51] Int. Cl.³ .......................................... H01L 21/265
[52] U.S. Cl. ....................................... 29/571; 29/578; 29/579; 29/580; 29/576 B; 148/187
[58] Field of Search ................. 29/571, 579, 578, 580, 29/576 B; 357/38, 23 VD; 148/1.5, 187, 190

[56] References Cited

U.S. PATENT DOCUMENTS

| | | | |
|---|---|---|---|
| 3,595,716 | 7/1971 | Kerr et al. | 148/186 X |
| 4,148,054 | 4/1979 | Hart et al. | 29/579 X |
| 4,242,791 | 1/1981 | Horng et al. | 29/578 |
| 4,345,265 | 8/1982 | Blanchard | 357/23 VD |

OTHER PUBLICATIONS

Leipold et al., "A FET-Controlled Thyristor in SIPMOS Technology", *Technical Digest of International Electron Devices Meeting*, Washington, D.C., Dec. 8, 1980, Institute of Electrical and Electronics Engineers, Piscataway, N.J., pp. 79-82.

Leung et al., "Refractory Metal Silicide/N+Polysilicon in CMOS/SOS", *Technical Digest of International Electron Devices Meeting*, Washington, D.C., Dec. 8, 1980, Institute of Electrical and Electronics Engr., Piscataway, N.J., pp. 827-830.

Specification & Drawings of Copending U.S. Patent Application Ser. No. 324,328, filed 11-23-81, by B. J. Baliga, "Methods for Fabricating Vertical Channel Buried Grid Field Controlled Devices Including Field Effect Transistors and Field Controlled Thyristors", pp. 1-29.

Specification & Drawings of Copending U.S. Patent Application Ser. No. 324,163, filed 11-23-81, by B. J. Baliga et al., "Vertical Channel Field Controlled Device Employing a Recessed Gate Structure and Methods of Making", pp. 1-29.

Specification & Drawings of Copending U.S. Patent Application Ser. No. 336,972, filed 1-4-82 by R. P. Love, "Self-Aligned Power MOSFET With Integral Source-Base Short and Methods of Making", pp. 1-35.

J. F. Gibbons, "Ion Implantation in Semiconductors—Part I: Range Distribution Theory and Experiments", Proceedings of the IEEE, vol. 56, No. 3, pp. 295-319, (Mar. 1968).

J. F. Gibbons, "Ion Implantation in Semiconductors—Part II; Damage Production and Annealing", Proceedings of the IEEE, vol. 60, No. 9, pp. 1062-1096, (Sep. 1972).

J. Hui, T. Y. Chiu, S. Wong, and W. G. Oldham, "Selective Oxidation Technologies for High Density MOS", *IEEE Electron Device Letters*, vol. EDL-2, No. 10, pp. 244-247, (Oct. 1981).

*Primary Examiner*—G. Ozaki
*Attorney, Agent, or Firm*—Charles E. Bruzga; James C. Davis, Jr.; Marvin Snyder

[57] ABSTRACT

Processes for manufacturing insulated-gate semiconductor devices such as MOSFETs wherein the source and base regions and the source-to-base ohmic short are formed employing self-aligned masking techniques are disclosed. In the exemplary case of a MOSFET, the processes begin with a semiconductor wafer (such as silicon) including a drain region, a gate insulating layer initially formed uniformly on the surface of the drain region, and a polysilicon conductive gate layer. Through subsequent masking and teching steps, channels are etched through the polysilicon gate layer at least to the drain region. The unetched portions define polysilicon gate electrodes spaced along the drain region. A two-stage polysilicon etch procedure is disclosed. An initial etch step produces relatively narrow channels. Unetched portions of the polysilicon layer are then used as masks to form a shorting extension of the device base region, preferably by ion implantation. In a subsequent lateral etch step, previously un-etched portions of the polysilicon gate electrode layer are etched to define insulated polysilicon gate electrode structures extending upwardly from and spaced along the principal surface. MOSFET source and base regions are then formed, preferably by vertical ion implantation, employing the polysilicon gate electrode structures as masks. Appropriate electrode metallization is applied.

12 Claims, 21 Drawing Figures

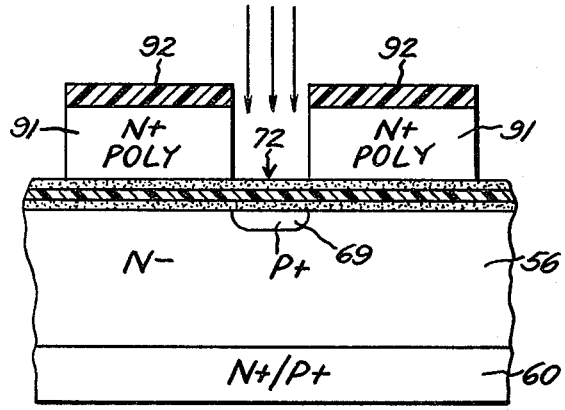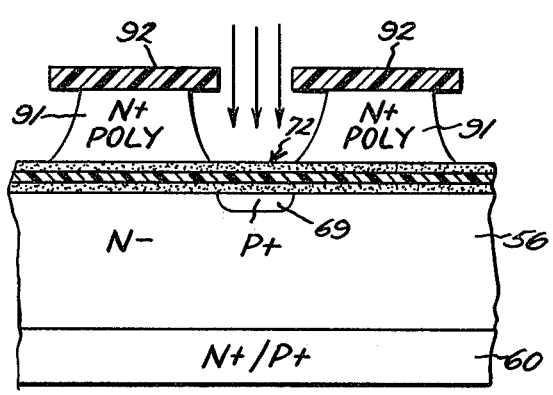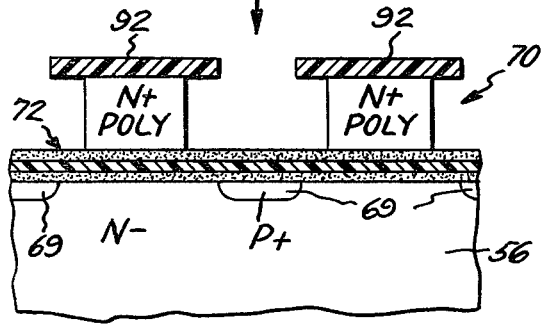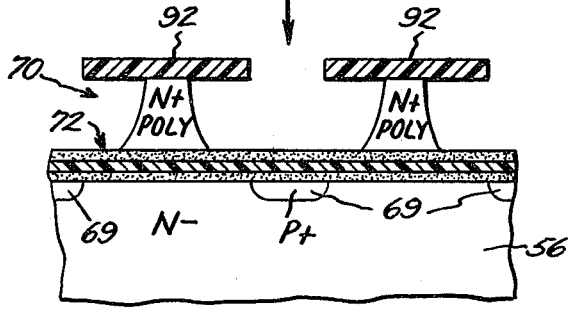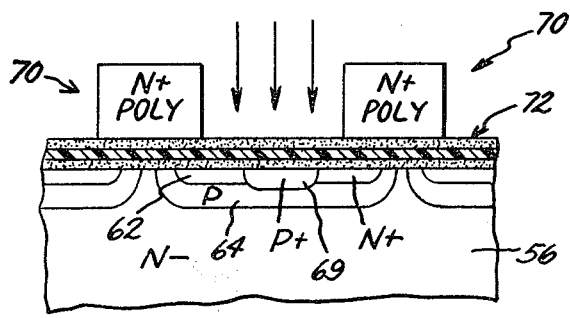

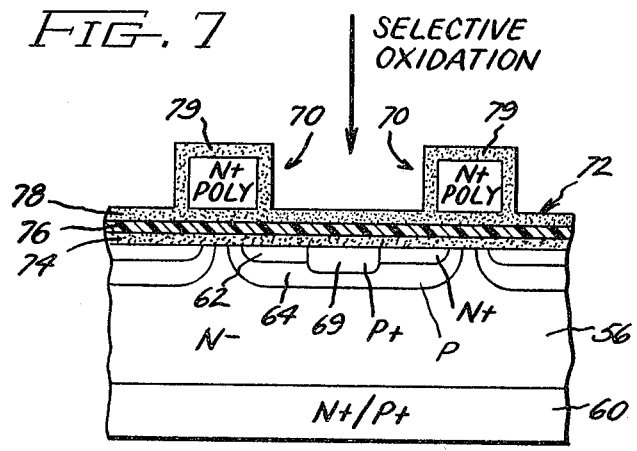
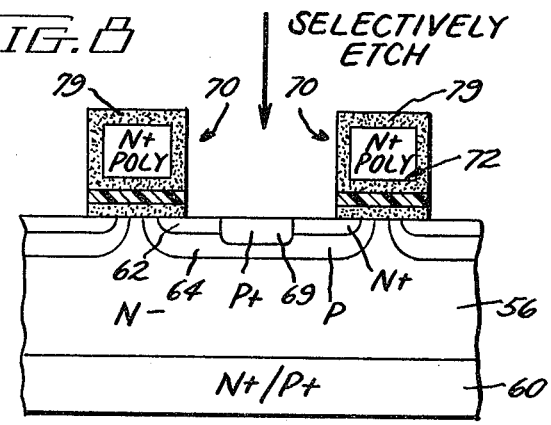
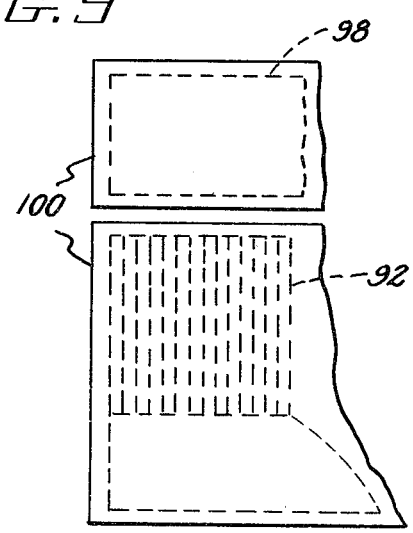

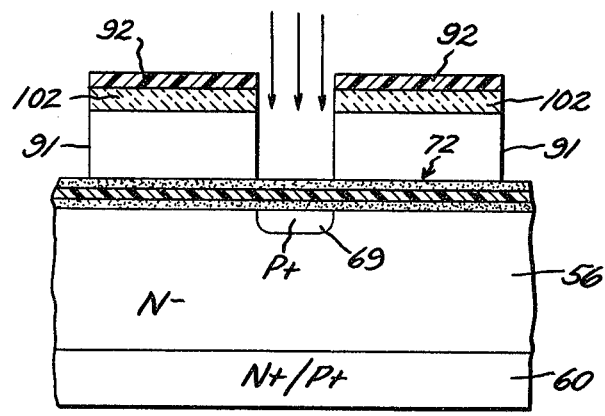
FIG. 10 — INITIAL PREPARATION P+ IMPLANT FOR SHORT
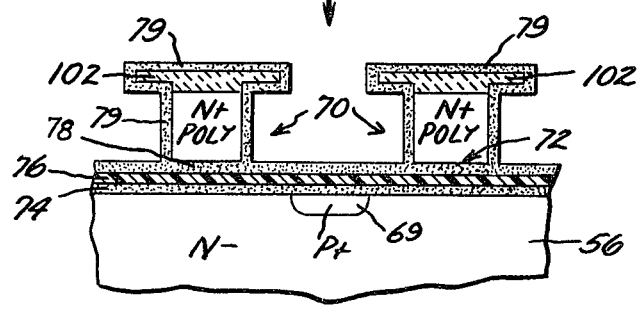
FIG. 11 — UNDERCUT ETCH SELECTIVE OXIDATION
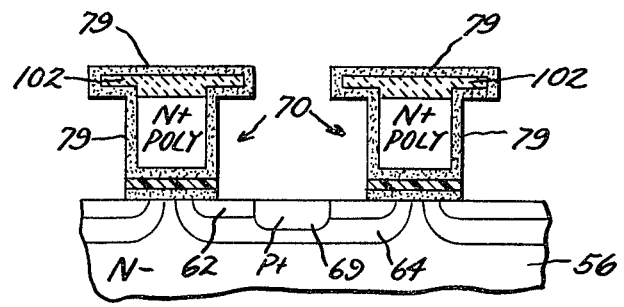
FIG. 12 — SELECTIVE ETCH FROM BASE AND SOURCE

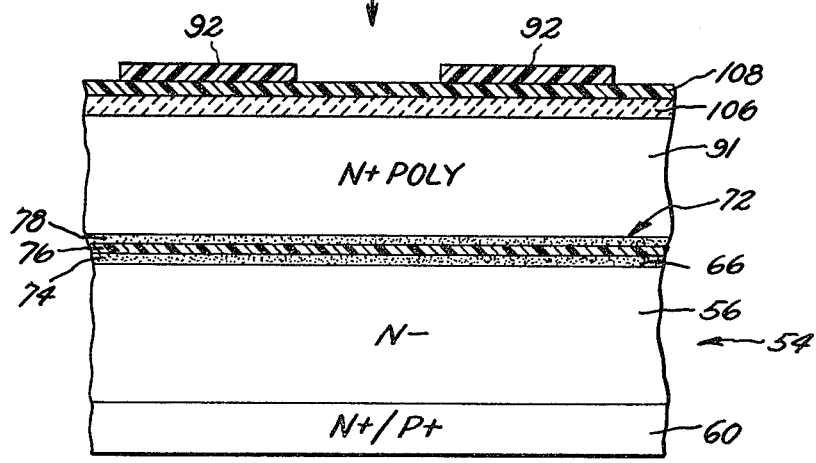
FIG. 13 — INITIAL PREPARATION
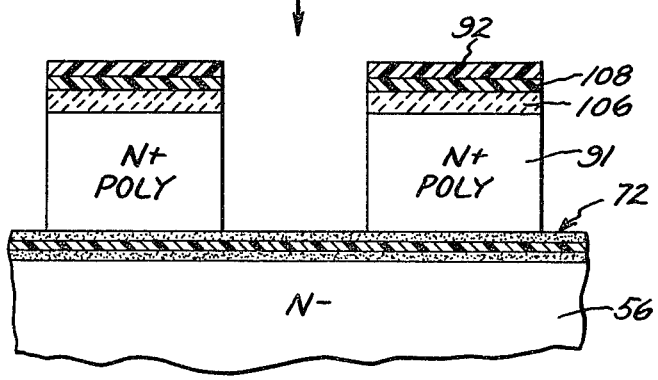
FIG. 14 — ETCH MINIMAL UNDERCUT
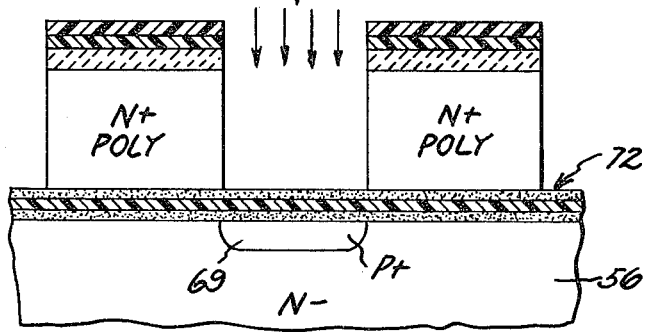
FIG. 15 — P+ IMPLANT FOR SHORT

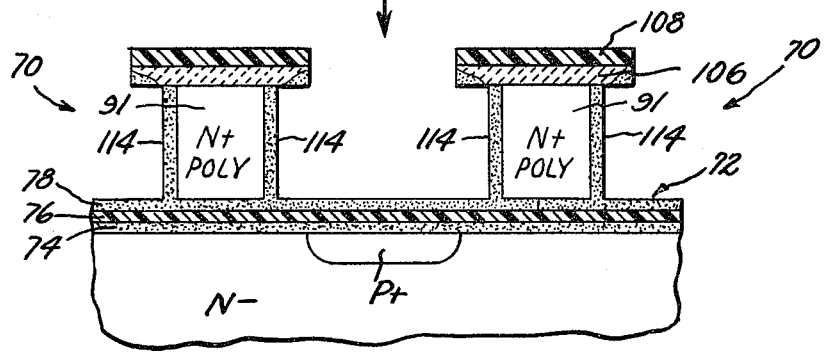
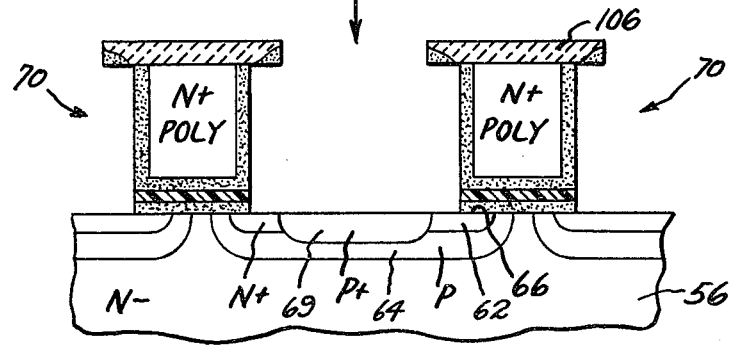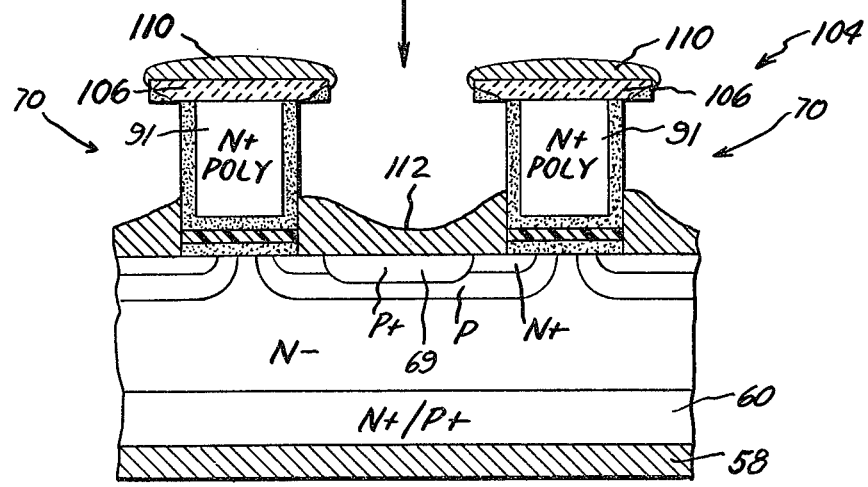

MINIMAL MASK PROCESS FOR MANUFACTURING INSULATED-GATE SEMICONDUCTOR DEVICES WITH INTEGRAL SHORTS

CROSS-REFERENCE TO RELATED APPLICATIONS

This application is a continuation of application Ser. No. 396,226, filed July 8, 1982 now abandoned.

The processes of the subject invention are in some respects alternatives to various processes disclosed in commonly-assigned U.S. patent application Ser. No. 406,731 filed concurrently herewith, by Victor A. K. Temple, and entitled "SELF-ALIGNED, MINIMAL MASK PROCESSES FOR MANUFACTURING INSULATED-GATE SEMICONDUCTOR DEVICES WITH INTEGRAL SHORTS"; and in commonly-assigned U.S. patent application Ser. No. 406,734, filed concurrently herewith, by Victor A. K. Temple and entitled "SELF-ALIGNED, MINIMAL MASK PROCESS EMPLOYING A TWO-STEP ETCH AND A COMBINED DIFFUSING AND SELECTIVE OXIDATION BARRIER FOR MANUFACTURING INSULATED-GATE SEMICONDUCTOR DEVICES WITH INTEGRAL SHORTS"; the entire disclosure of which are hereby expressly incorporated by reference. The above-referenced Temple application Ser. No. 406,731 is of additional note for its disclosure of various specific sub-processes useful in the practice of the present invention. Examples are various alternative sub-processes for opening source contact windows, such as by employing selective oxidation techniques, and various alternative sub-processes for forming source and base regions.

BACKGROUND OF THE INVENTION

The present invention relates generally to processes for manufacturing insulated gate power semiconductor devices such as MOSFETs, as well as other more complex devices including MOSFET-like structures, such as Insulated Gate Rectifier (IGRs), MOS-gated thyristors or other MOS-transistor or MOS-thyristor combinations. The invention more particularly relates to processes for forming the upper electrode and base regions of such devices without any critically-aligned masking steps, thereby reducing the minimum cell size.

Known power MOSFETs generally comprise a multiplicity of individual unit cells (sometimes numbering in the thousands or tens of thousands) formed on a single silicon semiconductor wafer in the order of 300 mils (0.3 in.) square in size and electrically connected in parallel. Each cell is typically about twenty-five microns in width. A number of geometric arrangements for the unit cells are possible, including elongated strips.

One particular known process for manufacturing power MOSFETs is a double diffusion technique which begins with a common drain region of, for example, N conductivity type semiconductor material, in turn formed on an N+ conductivity type substrate. Within the drain region a base region is formed by means of a first diffusion to introduce impurities of one type, and then a source region is formed entirely within the base region by means of a second diffusion to introduce impurities of opposite type. If the drain region is N type, then the first diffusion is done with acceptor impurities to produce a P type base region, and the second diffusion is done with donor impurities to produce an N+ type source region. At the drain region surface, the base region exists as a band between the source and drain regions.

Conductive gate electrodes are formed on the surface over the base region band and separated by a gate insulating layer to define an insulated gate electrode structure. Typically, the gate electrodes are formed of highly-doped polysilicon. When voltage of proper polarity is applied to the gate electrodes during operation, an electric field extends through the gate insulating layer into the base region inducing a conductive channel just under the surface. Current flows horizontally between the source and drain region through the conductive channel.

To form the insulated gate electrode structure, during initial wafer preparation a uniform gate insulating oxide layer and then a uniform layer of highly-doped polysilicon are grown over the drain region, prior to any introduction of impurities to form the base and source regions. Channels are then etched through the polysilicon layer and the gate insulating oxide to define the polysilicon gate electrode structures spaced along the drain region.

In a power MOSFET structure, the source, base and drain regions correspond respectively to the emitter, base and collector of a parasitic bipolar transistor. As is known, if this parasitic bipolar transistor is allowed to turn on during operation of the power MOSFET, the blocking voltage and the dV/dt rating of the power MOSFET are substantially degraded. Accordingly, in order to prevent the turn on of the parasitic bipolar transistor during operation of the power MOSFET, the layers comprising the source and base regions are normally shorted together by means of an ohmic connection.

This same general MOSFET structure can be included in other, more complex devices. For example, rather than an N+ conductivity type substrate, a P+ conductivity type substrate may be employed, which becomes the anode region in a MOS-gated thyristor or an Insulated Gate Rectifier (IGR) depending on short density. The previous N conductivity-type drain region is formed as before, but is more generally termed herein a "first region", while the P+ conductivity type anode is herein termed a "second region". The P conductivity-type base region is formed as before in the first region, and the N+ conductivity-type region is formed in the base region. In the case of an IGR, this latter N+ conductivity type region is not termed a source region as before, but rather is a rectifier cathode region or, more generally, an upper electrode region.

As another example, a third device region, of N+ conductivity type, may be provided below a moderated doped P second region to form the lower main electrode region of an MOS controlled thyristor.

In all of these cases, it will be appreciated that the MOS gate structure is essentially identical, and that the only substantial variations in the overall device structure are in the layers below the first region. In all cases, a short between the upper electrode region (whether termed a MOSFET source, an IGR cathode, or a main electrode region in a MOS-gated thyristor) and the base region is desired. In all cases, device metallization terminals are connected to the device's upper electrode region and the gate electrodes.

For convenience, the invention is described herein primarily in the context of a MOSFET. However, it will be appreciated in view of the foregoing that the invention is equally applicable to various other insulated-gate semiconductor devices.

Known power MOSFET designs in manufacture typically require five to seven masking steps, some of which must be aligned to each other with high accuracy to produce working devices. In particular, to form the source-base short, between the first and second diffusion steps a diffusion barrier is applied by means of selective masking over a portion of the base diffusion surface area to prevent the subsequent source diffusion from entering the base diffusion in the selectively masked area. Thus a shorting extension of the base region extends to the surface. Thereafter, the selective mask is removed, and metallization is applied for the source electrode. A portion of the source metallization also makes ohmic contact with the previously masked area of the base region.

The large number of masking steps and need for alignment in the prior art processes decrease the process yield. Further, due to the need to provide tolerance for misalignment, unit cell size is larger than would otherwise be needed, undesirably increasing spreading resistance effects. Additionally, prior art process generally provide encased gate electrode structures having remote gate electrode contacts, thus increasing the gate input impedance.

In the above-incorporated commonly-assigned Temple application Ser. No. 406,731, various processes are disclosed for manufacturing power MOSFETs and similar devices. These processes are characterized by involving a minimal number of photolithographic masking steps and being fail-safe in a number of respects. In the processes disclosed in the above-identified Temple application Ser. No. 406,731, polysilicon gate MOSFETs are manufactured beginning with a semiconductor wafer including a drain region, a gate insulating layer initially formed uniformly on the surface of the drain region, and a polysilicon conductive gate layer. Through subsequent masking and etching steps, channels are etched through the polysilicon gate layer and then on through the gate insulating layer to the drain region. In general, the processes of Ser. No. 406,731 employ a single undercut etch step which leaves an overhanging layer over the polysilicon gate electrodes. The unetched portions define polysilicon gate electrode structures spaced along the drain region. Employing these polysilicon gate electrode structures as masks, impurities are introduced into the drain region through the surface between the gate electrodes, and then driven by thermal diffusion to from appropriately located base and source regions. The source region is located both laterally and vertically within the base region. In accordance with various specific processes there disclosed, these base and source impurities are introduced either by ion implantation, or from a gas source, or a combination of the two. In the case of ion implantation, the impurities in some process variations are introduced through the gate insulating layer. A number of process alternatives are disclosed for forming a shorting extension of the base region up through and to a portion of the surface of the source region. Many of these process alternatives employ the overhang left by the undercut etch of the source region surface portion and therefore are self-masked. Two general MOSFET structures are formed in accordance with the processes disclosed in application Ser. No. 406,731. One structure has metallized gate terminal fingers, and is formed employing one-mask processes. The other structure has gate fingers encased in insulating oxide and connected to remote gate contacts, and is formed employing the three-mask processes. The preferred processes for both structures require selective oxidation of the polysilicon gate electrode material, and various approaches to this selective oxidation are described.

In the other above-incorporated patent application, Temple application Ser. No. 406,734, various process alternatives are disclosed, characterized generally by employing a two-step etch process to form the source-to-base short, without any requirement for an undercut etch leaving an overhang for self-masking. (However, for automatic separation of source and gate metallization, an overhanging layer of a conductive refractory material is beneficial.)

In brief, the process alternative of Ser. No. 406,734 employs the following sequence for forming the source-to-base short: (1) Following initial wafer preparation, a narrow etch to the drain region to form a narrow channel. (2) Form an initial base region and then form a nitride mask, both while employing the sides of the narrow channel as masks. (3) A lateral etch to widen channel, leaving the nitride mask spaced from gates. (4) Diffusion to form source and base regions and selective oxidation of gate sidewalls, both processes employing the nitride mask.

The present invention provides an alternative two-step etch process for forming the source-to-base short.

SUMMARY OF THE INVENTION

Accordingly, it is an object of the invention to provide a self-aligned process for manufacturing insulated-gate semiconductor devices, and, particularly, in the exemplary case of a MOSFET, for forming the source and base regions and the ohmic short between the source and base regions.

It is another object of the invention to provide such processes which are suitable for devices having either directly metallized gate contact fingers or remote gate electrode contacts.

Briefly, and in accordance with one aspect of the invention, a self-aligned process for manufacturing an insulated-gate semiconductor device begins with providing a semiconductor wafer such as silicon including a first device region such as a MOSFET drain region of one conductivity type, for example N type, having a principal surface. This wafer is initially prepared by successively forming a gate insulating region layer, for example of silicon dioxide, and a conductive gate electrode layer, such as highly-doped polysilicon, for example of N+ conductivity type. If the power MOSFET being formed is of the type having gate fingers encased in insulating oxide and connected to remote gate contacts, the polysilicon gate electrode layer is ready for masking. If a MOSFET structure having metallized gate terminal fingers is being manufactured, preferably an upper mask layer which will withstand high temperature processing, for example of silicon nitride, is formed over the polysilicon gate electrode layer.

Next, an etch resist mask is formed generally on the wafer, the etch resist mask having openings generally defining the ultimate locations of source regions. One specific process embodiment for forming encased-gate electrode MOSFET structures is a three-mask process and, accordingly, this etch resist mask is the first mask employed in the process. Another specific process embodiment for forming a power MOSFET with metallized gate terminal fingers is a one-mask process, and the etch resist mask is the only mask employed in the process.

A two-stage polysilicon etch procedure is employed. The first etch stage occurs next. By means of an appropriate etching process, the polysilicon conductive gate electrode layer is etched at least to the gate insulating layer to form relatively narrow channels.

Impurities appropriate to form shorting regions of opposite conductivity type, for example of P conductivity type, are then introduced into the drain region, for example by ion implantation, which may be substantially vertical. During this step, unetched portions of the polysilicon gate electrode layer serve as masks. In a preferred form, the ion implantation of shorting region impurities is carried out prior to removal of the gate insulating region layer, and the ion implantation is through the gate insulating layer. At some point in the process, either immediately or in combination with a later diffusion or heating step, the shorting region impurities are diffused or driven, for example thermally, at least vertically to a predetermined depth such that the shorting region extends from the principal surface to the predetermined depth.

The previously un-etched portions of the polysilicon gate electrode layer are then laterally etched in a second etch stage to define insulated polysilicon gate electrode structures extending upwardly from and spaced along the principal surface. The etch resist mask may be removed.

At this point, impurities are introduced into the drain region appropriate to form base regions of opposite conductivity type, for example P type, and impurities appropriate to form source regions of the one conductivity type, for example N+ conductivity type, within the base regions. The impurities introduced are thermally diffused to appropriately locate and configure the base and source regions such that at the principal surface the base regions exist as bands of opposite conductivity type between source regions and the common drain region, with active portions of the base region bands underlying at least portions of the insulated polysilicon gate electrode structures. In order to allow a source-to-base short to be completed in a subsequent source metallization step, the base regions and corresponding shorting regions form continuous regions of the opposite conductivity type below the principal surface.

The source and base region impurities are preferably introduced by ion implantation through the gate insulating region layer, although gas source diffusion may also be employed if the gate insulating region layer is removed first. Significantly, in the case of ion implantation, vertical implantation can be employed, in contrast to various processes disclosed in the above-referenced Temple application Ser. No. 406,731 wherein a deliberate overhang layer is formed for defining the location of the shorting region by one of several self-masking techniques.

At some point in the process, at least the polysilicon gate electrode sidewalls are oxidized. Preferably, in order to allow source metallization to contact the source region without requiring a separate masking step to open source contact windows, a selective oxidation process is employed to oxidize the polysilicon gate sidewalls without oxidation of the surface of the source region. As more fully described in the above-incorporated Temple application Ser. No. 406,731, there are two general approaches to such selective oxidation which may be employed.

In the first approach, a silicon nitride layer is included in the gate insulating layer. Selective oxidation of the polysilicon gate electrodes is accomplished by heating in the presence of the oxygen prior to removal of the gate insulating layer over the source region. Thus, oxidation of the source region is masked by the nitride layer.

In the second selective oxidation approach of the invention, no nitride is included in the gate insulating layer. This can be a benefit in terms of performance of the finished device due to unstable charges which can exist in nitride/oxide sandwiches. Instead, a nitride oxidation mask layer is formed over the source region later. This nitride oxidation mask layer may for example be formed by ion implantation or by low pressure vapor deposition.

The processes may be relaxed somewhat, at the expense of requiring another masking step, by eliminating any silicon nitride oxidation mask layer over the source region and allowing the source region surface to oxidize. To provide source contact windows the oxide is etched employing a mask. While an additional aligned mask step is required, the source-to-base short is still formed without need for a masking step.

At this point, the gate insulating region layer is removed, if it has not previously been removed, thus exposing silicon in the source region.

The remaining steps in the fabrication process are metallization steps. In the case of the one-mask process for forming MOSFET structures with metallized gate terminal fingers, metal, for example aluminum, is deposited, such as by evaporation, onto the wafer surface, and automatically separates into upper gate contact regions and lower source contact regions. In the case of the three-mask process for forming encased gate electrode fingers, an additional masking and etching step is employed to etch gate contact windows on a portion of the wafer other than the location of source regions, and a third masking step is employed to pattern the metallization into separate source and gate electrode regions.

One of the advantages of the present invention is the fail-safe nature of many of the processes described. While an individual unit cell may not be perfectly formed, the entire device will not be failed. Higher process yields thus result. One such example is a photoresist error in the initial mask, such as resist being present where it should not be, or not being present where it should be. In such an event, a unit cell may be inoperative, but the device as a whole will be operable. Another example is a failure to provide a source-to-base short in some area of the device.

The potentially fatal failure modes are relatively few. One example is a metallization error, where the source and gate metallization connect, shorting the device.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description, taken in conjunction with the drawings, in which:

FIGS. 4A and 4B each depict a vertical implant step to form a short region in the wafers of FIGS. 3A and 3B respectively;

FIGS. 5A and 5B depict a subsequent lateral etching step in the respective wafers of FIGS. 4A and 4B;

FIG. 6 depicts the FIG. 2 wafer after photoresist has been removed and base and source regions have been implanted;

FIG. 7 depicts selective oxidation of the polysilicon gate tops and sidewalls;

FIG. 8 depicts the FIG. 2 wafer after etching of the gate oxide to expose the source region just prior to metallization to form the FIG. 1 structure;

FIG. 9 is a plan view depicting, in overlapping registration form, three successive masks to form the device depicted in FIG. 1;

FIG. 10 depicts a variation in the three mask process for forming an encased-gate structure with a molybdenum silicide layer over the polysilicon gate electrode;

FIG. 11 depicts the FIG. 10 wafer following undercut etching and selective oxidation of the gate electrode;

FIG. 12 depicts the FIG. 10 wafer after the gate insulating region over the source has been removed, and the base and source regions have been formed by gas source diffusion;

FIG. 13 depicts an initial preparation step in accordance with a one-mask, metallized-gate electrode process of the invention;

FIG. 14 depicts a first etch step on the FIG. 13 wafer with minimal undercutting;

FIG. 15 depicts a vertical implant to form a short region;

FIG. 16 depicts a subsequent lateral etch step and a selective oxidation;

FIG. 17 depicts the forming of source and base regions; and

FIG. 18 depicts a metallization step to reach the final metallized-gate device structure.

DETAILED DESCRIPTION OF THE PREFERRED EMBODIMENTS

Preliminarily, it should be noted that for convenience the devices and fabrication processes of the invention are described herein primarily in the context of a MOSFET having N+ conductivity type source, P conductivity type semiconductor base or channel regions, and N— conductivity type semiconductor drain regions. More generally, the processes of the invention are described in the context of an insulated-gate semiconductor device having an N+ conductivity type upper terminal region, a P conductivity type base region, and an N conductivity type first region. It will be appreciated, however, that the invention is equally applicable to devices wherein the active regions formed are of opposite conductivity type.

One general form of device is characterized by having gate electrodes encased in insulation oxide, in turn surrounded by upper terminal region metallization. Remote gate contacts are employed. There need be only a single conductive layer in the gate electrode, although some forms employ a second layer for lower gate input resistance. This form of device is fabricated employing three-mask processes as described in particular with reference to FIGS. 1–12.

The invention is also applicable to devices generally characterized by having metallized gate terminal fingers for low gate input resistance to permit high frequency operation. This form of device is fabricated employing one-mask processes as described herein with reference to FIGS. 13–18.

Nevertheless, it should be noted that the three-mask, encased gate electrode process has a number of advantages. For one, the source, base and short regions can all be implanted without requiring angled ion implantation to form the source and base regions as is required where there is an overhang layer. For another, there is no need to form a protective layer on the top surfaces of the polysilicon gate electrodes which is capable of withstanding high temperature processing. No masking layer need survive high temperature processing in several specific forms.

It should further be noted that the processes as described in detail below are the specific forms which are presently preferred. It will be appreciated, however, that the processes and process variations may be employed in combinations other than those specifically described hereinbelow and, further, that the various process steps may be done in a number of orders different than those which are specifically described herein.

Encased Gate Electrode Devices

Figure 1:
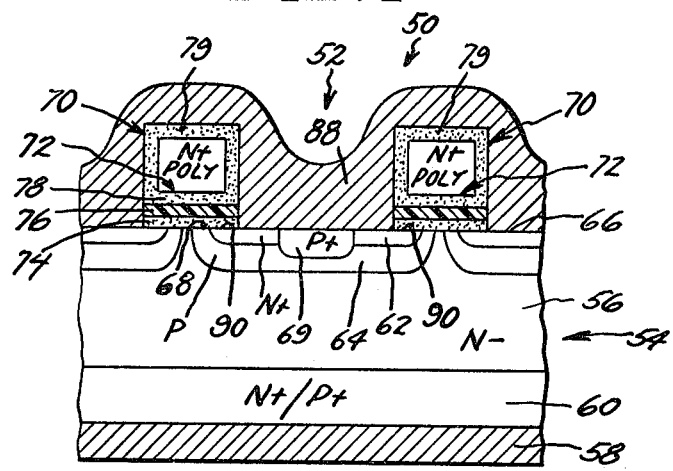
FIG. 1 is a cross sectional view of the active portion of an encased-gate MOSFET fabricated in accordance with an exemplary three-mask process of the present invention.

Referring now to FIG. 1 in detail, shown in partial cross section is the active portion of a power MOSFET 50, with one unit cell 52 completely shown, and adjacent unit cells partially shown. As is known, a power MOSFET comprises a number of unit cells, formed in a single semiconductor wafer 54 and electrically connected in parallel. The unit cells 52 have a common drain region 56 of N— conductivity type silicon semiconductor material having a common metallized terminal 58 in ohmic contact through a highly-doped N+ conductivity type substrate 60. While silicon is the presently-preferred semiconductor material, there are other possibilities, such as gallium arsenide.

The unit cells 52 have individual N+ conductivity type source 62 and P conductivity type base 64 regions formed within the drain region 56. At the wafer 54's surface 66, each base region 64 exists as a band 68 of P conductivity type semiconductor material between N type source 62 and drain 56 regions. In order to prevent turn on of the parasitic bipolar transistor formed by the N+ type source 62, P type base 64, and N— type drain 56 regions, a source-to-base short is provided comprising a P+ conductivity type shorting region 69 or extension of the base region 64 up through the source region 62 to the surface of source region 62. The short is completed by a portion of the source metallization.

To produce an enhancement mode channel for field effect transistor operation, conductive gate electrodes, generally designated 70, separated by a gate insulating layer, generally designated 72, are positioned on the surface 66 at least over the band 68 of P conductivity type semiconductor material comprising the base region 64. Thus, between the gate electrodes 70, channels are defined with the source 62 (and short 69) regions at the channel bottoms.

In one form, the gate insulating layer 72 is of sandwich construction. For reasons described below in detail, this form of gate insulating layer comprises a first oxide layer 74 comprising silicon dioxide, a nitride layer 76 comprising silicon nitride, and, if desired, a second oxide layer 78 also comprising silicon dioxide.

The polysilicon gate electrodes 70 are completely encased in a protective oxide layer 79, including both sidewalls and tops. Source metallization 88 covers the entire active portion of the wafer, including the encased polysilicon gate electrodes 70. Accordingly, remote gate contacts are required, resulting in a higher gate input resistance. (It may be noted, however, that an embodiment described hereinbelow with reference to FIGS. 10–12 provides a lower gate resistance).

As will be seen from FIG. 1, the source metallization 88 is in ohmic contact with both the source region 62 and the shorting region 69 to effect ohmic contact between the source 62 and base 64 regions.

The base 64, source 62 and shorting 69 regions of FIG. 1 reach their ultimate locations by means of thermal diffusion or driving steps hereinafter described. The approximate locations of these regions are depicted in FIG. 1 wherein it may be seen that the base surface portion 68 lies wholly beneath the conductive gate electrode 70, and there is accordingly overlap, as at 90, of the conductive gate electrode 70 over the source region 62. The diffusion processes must be controlled such that the overlap 90 is greater than or at least equal to zero; i.e., the overlap 90 must exist.

In operation, each unit cell is normally non-conducting with a relatively high withstand voltage. When a positive voltage is applied to the gate electrode 70, an electric field is created and extends through the gate insulating layer 72 into the base region 64, drawing electrons out of the P conductivity type base region 64 to induce a thin N type conductivity channel just under the surface 66 below the gate electrode 70 and the insulating layer 72. As is known, the more positive the gate voltage, the more conductive this channel becomes and the more working current flows. Current flows horizontally near the surface 66 between the source 62 and drain 56 regions, and then vertically through the remaining drain region 56 and through the substrate 60 to the metal drain terminal 58.

Other Insulated-Gate Devices

As summarized hereinabove, the general MOSFET structure depicted in FIG. 1 is representative of insulated-gate semiconductor devices in general, to various of which the processes of the inventions are equally applicable.

For example, to provide an Insulated Gate Rectifier (IGR), or MOS-gated thyristor (MGI) the substrate 60 would be of P+ conductivity type, as indicated alternatively in FIG. 1, and would comprise the IGR or MGT anode region. The N− conductivity-type region 56 is then more generally herein termed a first region, and the substrate 60 is herein more generally termed a second region. The source region 62 comprises the IGR or MGT cathode, and is herein more generally termed an upper terminal region.

As will be appreciated, usual device manufacturing processes generally begin with the lower region layer, and the upper layers are then successively formed such as by epitaxial growth techniques.

For convenience, the detailed processes of the invention are described hereinbelow with reference to a MOSFET, but it will be appreciated that the processes of the invention apply equally well to these and other forms of insulated-gate semiconductor devices in general.

Three-Mask Encased Gate Electrode Process of FIGS. 2–9

Figure 2:
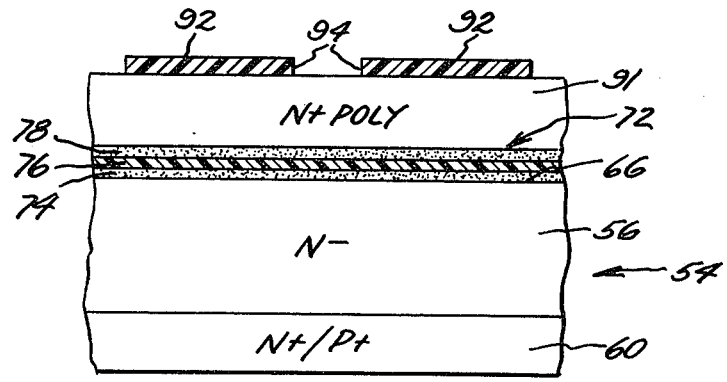
FIG. 2 depicts an initial preparation step in a representative process for fabricating the device of FIG. 1.

With reference to FIG. 2, the silicon semiconductor wafer 54 including the drain region 56 of N− conductivity type is initially provided by starting with a suitable low resistivity wafer substrate 60, which may for example be a ten mil, 0.001 ohm-centimeter N+ conductivity type substrate. The drain region 56 is epitaxially grown over the wafer 60, and is for example two mils thick, with a twenty-five ohm-centimeter resistivity. This is a typical 500 volt structure.

Next, the gate insulating layer 72 is formed on the drain region 56 surface 66 by successively growing the first oxide layer 74, the nitride layer 76 and the second oxide layer 78. The oxide layers 74 and 78 may be grown by thermal oxidation and chemical vapor deposition, respectively. The nitride layer 76 may be grown by chemical vapor deposition. The nitride layer 76 is included to facilitate selective oxidation of the polysilicon gate 80 sidewalls, but may be omitted in process variations where a nitride oxidation mask is formed at a later intermediate step in the process, or where an additional masking step is employed to open source contact windows. The second gate oxide layer 78 is also optional, but is included to facilitate selective oxidation of the polysilicon gate electrode material while protecting the nitride layer 76 in that many polysilicon etchants attack silicon nitride, but are resisted by silicon dioxide. Further, this oxide layer 78 reduces mechanical stresses in the gate insulating layer 72 generally, and at the interface between the gate insulating layer 72 and a polysilicon layer 91, formed as described below.

Next, a high conductivity polysilicon layer 91 of appropriate thickness for the ultimate gate electrode 70 (e.g. 1.0 micron) is formed over the gate insulating layer 72. Preferably the gate electrode layer 91 comprises polysilicon highly-doped with either N+ or P+ conductivity type impurities, N+ conductivity type being illustrated. Ther are other materials, however, which may be employed for the conductive gate electrode layer 91, such as a metal silicide. Whatever material is employed, its general requirements are that it (1) be controllably oxidizable, (2) be etchable by a process or etchant which does not etch oxide, (3) have good conductivity, and (4) have a reasonable thermal expansion match to silicon.

Subsequent to initial wafer preparation, a first etch resist mask 92 is photolithographically formed, having openings 94 defining the ultimate locations of source and short regions, as is more fully described hereinafter with reference to FIG. 9.

Figure 3A:
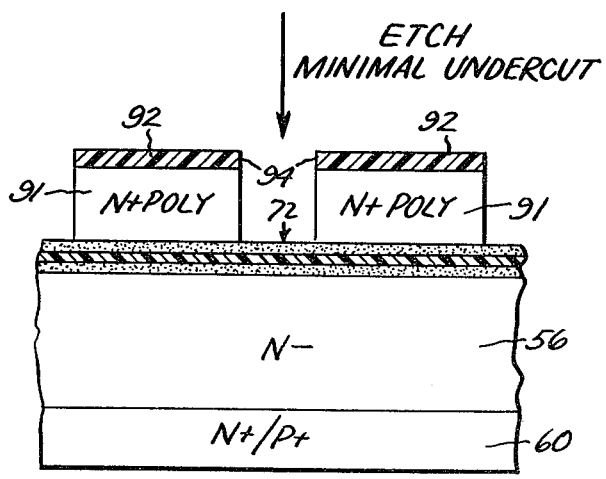
FIGS. 3A and 3B depict subsequent etching steps on the FIG. 2 wafer with minimal undercutting, FIG. 3A depicting selective etching to form substantially vertical sidewalls, and FIG. 3B depicting isotropic etching.
Figure 3B:
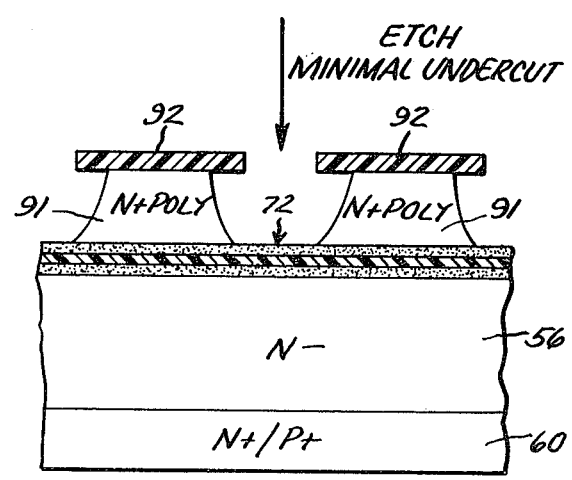

Next, an initial etching step is done, as may be seen in FIGS. 3A and 3B. This initial etching step is done in areas defined by the first mask 92 openings 94 through the polysilicon gate electrode layer 91 down to the gate insulating layer 72. FIG. 3A illustrates the result of a preferred preferential etch, and FIG. 3B represents the results of an acceptable isotropic etch.

The preferential etch of FIG. 3A is preferred in the case of encased gate electrode devices because it results in a smaller unit cell size. In the case of metallized gate electrode devices fabricated employing a one-mask process as described hereinbelow with reference to FIGS. 16–18, a directional etch to form vertical sidewalls may be considered essential in order to facilitate automatic separation of the metallization into source and gate terminals. For etching substantially vertically through polysilicon, a number of known processes may be employed, generally known as dry etching processes, which involve electric fields to establish directionality. One particular dry etching process suitable for use in the practice of the present invention is reactive ion etching.

The presence of the second oxide layer 78 aids in the etching process by protecting the nitride layer 76 from polysilicon etchant. For example, many plasma etches etch polysilicon well and silicon nitride fairly well, but stop at silicon dioxide.

Subsequent to the initial etching step depicted in FIGS. 3A and 3B, impurities for forming the short region 69 are introduced into the drain region 56 by means of ion implantation through the gate insulating layer 72. As depicted in FIGS. 4A and 4B this implantation of shorting region impurities is accomplished substantially vertically, with the etch resist mask 92 and the un-etched portions of the gate electrode layer 91 serving as a mask during implantation. This implantation of shorting region 69 impurities is a relatively shallow one and/or is done with a relatively slower-diffusing P type impurity such as indium because, at the conclusion of the process, the depth of the shorting region 69 should not be much greater than the depth of the source region 62.

Known ion implant processes may be employed, such as those described in J. F. Gibbons, "Ion Implantation in Semiconductors—Part I: Range Distribution Theory and Experiments", Proc. IEEE, Vol. 56, No. 3, pp. 295-319 (Mar. 1968); and J. F. Gibbons, "Ion Implantation in Semiconductors—Part II: Damage Production and Annealing", Proc. IEEE, Vol. 60, No. 9, pp. 1062-1096 (Sept. 1972).

Then, with reference to FIGS. 5A and 5B, subsequent to the step of introducing shorting region impurities the previously un-etched portion of the gate electrode layer 91 is laterally etched to undercut the mask 92, and to define the ultimate size of the gate electrodes 70. The first etch resist mask 92 is then removed.

At this point, and with reference to FIG. 6, as intermediate steps subsequent to the lateral etching step of FIGS. 5A and 5B, impurities are introduced into the drain region between the polysilicon gate electrodes 70 appropriate to form the base region 64 and the source region 62. These regions may be formed by diffusion, or by ion implantation, as is specifically illustrated in FIG. 6. Significantly, the ion implantation may be done vertically because there is nothing overhanging the gate electrodes 70.

To ensure against the formation of PN junctions in the polysilicon electrodes 70, a nitride layer (not shown) formed by chemical vapor deposition may be included under the etch resist mask 92, and removed after ion implantation.

Next, the gate electrode 70 tops and sidewalls are selectively oxidized to grow the encasing oxide layer 79, resulting in the structure of FIG. 7.

As a significant aid to this selective oxidation, the prior ion implantation of the short 69, base 64 and source 62 region impurities, as described just above, is done through the gate insulating layer 72, which remains substantially intact. At some point subsequent to implantation, the impurities are driven by thermal diffusion to appropriately locate the base 64 and source regions 62. This diffusion may be done all at once, or in stages. (For convenience, FIGS. 1 and 7 depict the positions of these after diffusion, and thus FIGS. 1 and 7 do not accurately depict their locations immediately subsequent to implantation.)

Preferably, diffusion of the base region 64 and source region 62 impurities to drive them to their ultimate locations is done simultaneously with a selective oxidation step depicted in FIG. 7. In the most efficient process all implants are done at the same time, and then all driven at the same time during the selective oxidation step.

More particularly, and with reference to FIG. 7, as an intermediate step in the process, the polysilicon gate electrode 70 sidewalls are selectively oxidized by heating in the presence of oxygen to grow the oxide layer 79, which is much thicker than the first oxide layer 74 of the gate insulating region layer 72. Although not shown, the second gate oxide layer 78 in the source region preferably is selectively etched to expose the silicon nitride layer 76 prior to selective oxidation of the polysilicon gate 80 sidewalls. Oxidation of the source region 62 between the polysilicon gate electrode 70 would then be masked by the nitride layer 76 in the gate insulating region 72. Further information concerning selective oxidation techniques may be found by reference to an article by J. Hui, T. Y. Chiu, S. Wong, and W. G. Oldham, "Selective Oxidation Technologies for High Density MOS", IEEE Electron Device Letters, Vol. EDL-2, No. 10, pp. 244-247 (October 1981).

At this point, the device is ready for final processing to expose the source 62 and short regions 69 for metallization, to open gate contact windows, to metallize, and metallization patterning.

In particular, with reference to FIG. 8, the nitride 76 and oxide 74 and 78 (if still present) layers of the gate insulating layer 72 are removed between the gate electrodes by selective etching employing a suitable etchant such as buffered hydrofluoric acid for oxides and hot phosphoric acid for nitride to expose bare silicon on the surface of the source region 62 and portions of the source region 62. As is known this is done by means of a first mask 92, the outline of which may be seen in FIG. 9. Etching of the oxide layers 74 and 78 in the gate insulating layers 72 is readily accomplished without removing the gate encasing oxide layer 79 (formed as depicted in FIG. 7) because the gate encasing oxide layer 79 is much thicker. While some etching occurs, it is not etched through.

Remote gate contact openings are then made through the encasing oxide layer 79 on a portion of the wafer other than at the location of the active region of the device 50. As is known, this is done by means of a second mask 98, the outline of which may be seen in FIG. 9.

Metal 88 is then evaporated onto the entire wafer as depicted in FIG. 1, and then patterned employing a third mask 100 (FIG. 9) to separate the metallization into source and gate regions.

Higher Conductivity Buried Gate Process—FIGS. 10-12

In order to lower the gate input resistance in the encased gate electrode structure with remote gate contacts, the gate electrode 70 may include a layer of a refractory metal silicide such as molybdenum silicide over the polysilicon layer 91. Molybdenum silicide is more conductive than even highly-doped polysilicon, and yet can be oxidized at the surface to permit the gate electrode structure 70 to be encased.

Referring specifically to FIG. 10, the initial preparation steps are essentially as described above with reference to FIGS. 2 and 3A, except that a molybdenum silicide layer 102 is formed over the polysilicon gate electrode layer 91 under the first etch resist mask 92. The shorting region 69 is formed as described above by ion implantation of P type impurities in sufficient concentration to form the P+ conductivity type region.

Next, as illustrated in FIG. 11, an undercut etch is performed. Unlike the specific process described above with reference to FIGS. 2–9, as illustratively shown in FIG. 11 the selective oxidation is done prior to the introduction of the source and base region impurities, and these impurities are introduced by means of gas source diffusion, described hereinbelow with reference to FIG. 12.

As depicted in FIG. 11, the oxide layer 79 is formed not only on the polysilicon portions 91 of the gate electrodes 70 but on the molybdenum silicide portions 102 as well.

Next, as depicted in FIG. 12, the gate insulating layer 72 is removed between the gate electrodes 70, and impurities introduced from a gas source to form the base 64 and source 62 regions. These regions 62 and 64 are driven to their ultimate locations by thermal diffusion, in a non-oxidizing atmosphere.

At this point, further processing to form remote gate contacts proceeds as described hereinabove with reference to FIGS. 8 and 9.

From a comparison of the process of FIGS. 2–9 with the process of FIGS. 10–12, it will be appreciated that numerous variations in the specific order of process steps are possible, particularly as to when the selective oxidation takes place.

Processes Avoiding Silicon Nitride In the Gate Insulating Layer

In the processes described herein up to this point, in order to facilitate selective oxidation of the polysilicon gate electrode 70 sidewalls, a silicon nitride layer 76 is included within the gate insulating layer 72. Although no purpose is served after the selective oxidation of the polysilicon gate electrode 70 sidewalls, necessarily the unetched portions of this nitride layer 76 remain in the active portion of the gate insulating region between the conductive gate electrodes 70 and the surface 68 of the base region 64.

It has been found that silicon dioxide/silicon nitride sandwiches can have built-in charges or unstable charges due, mostly thought to be located at the nitride/oxide interface. These charges are sufficient to create difficulties in MOS structures containing them, for example, by making it difficult to invert the conduction channel.

Accordingly, in accordance with this alternative no nitride layer is included within the gate insulating oxide layer formed during initial wafer preparation, and a nitride oxidation mask layer is formed at a later intermediate step in the process. This alternative is more fully described in the above-incorporated Temple application Ser. No. 406,731. However, for convenience it is summarized next.

Briefly, a silicon semiconductor wafer is initially provided as before, including a drain region 56. However, rather than the sandwich-type gate insulating layer 72 of FIG. 1, a single gate insulating oxide layer, such as the first oxide layer 74, is formed on the drain region surface 66. The remaining initial preparation steps proceed as described hereinabove, the only difference being that no silicon nitride is included in the gate insulating layer.

At an appropriate point in the process, a silicon nitride oxidation mask layer (not shown) is formed over the short 69 and source 62 regions between the polysilicon gate electrodes 70 so as to facilitate selective oxidation of the polysilicon gate electrode 70 sidewalls. As described in the above-referenced Hui et al article entitled "Selective Oxidation Technologies for High Density MOS", there are a variety of ways in which the nitride oxidation mask layer (not shown) may be formed. As one example, the nitride oxidation mask is formed by ion implantation, at an angle if need be so as to cover the entire source region between the polysilicon gate electrodes 70, but yet avoiding the polysilicon gate electrode sidewalls themselves. With ion implantation processes, the nitrogen is implanted just into the silicon or, in the event the oxide layer 74 has not yet been removed, into both the oxide and the silicon.

Alternatively, the nitride oxidation mask may be formed by low pressure chemical vapor deposition. Yet another alternative is sputtering. Preferential growth techniques, or angled vapor direction should be employed to avoid forming a nitride layer on the polysilicon gate 70 sidewalls.

Alternative Processes without Nitride Selective Oxidation Mask

As also described in the above-incorporated Temple application Ser. No. 406,731 the processes may be relaxed somewhat, at the expense of requiring another masking step, by neither including the silicon nitride layer 76 in the gate insulating layer as described hereinabove with reference to FIGS. 2–12, nor forming a nitride oxidation mask (not shown) layer as summarized immediately above. Rather, the source region 62 surface is allowed to oxidize at the same time the gate encasing oxide 79 is grown, and source contact windows are later formed by removal of the source region oxide. Typically, the source contact windows are opened employing a precisely-aligned mask as is conventionally done. Other processes might also be employed, such as reactive ion etching or ion milling with a collimated beam having a high selectivity ratio for silicon dioxide over silicon.

In any event, the critically-aligned masking step conventionally required for source-to-base short formation is avoided in accordance with the processes of the invention.

One-Mask Metallized Gate Electrode Process of FIGS. 13–18

Described now is an alternative two-stage polysilicon etch process for forming an insulated-gate semiconductor device having metallized gate electrodes, the ultimate device structure being represented by the MOSFET 104 depicted in FIG. 18.

Referring now to FIG. 13 in detail, a representative process begins generally as described hereinabove with reference to FIG. 2, with the exception that a layer 106 of a refractory metal silicide, such as molybdenum silicide, protected by a layer 108 of, for example, silicon nitride are formed over the polysilicon gate electrode layer 91, and under the photolithographically-produced etch resist mask 92.

Portions of the conductive layer 106 remain in the completed device structure 104 of FIG. 18 and, accordingly, the conductive layer 106 may be termed a second conductive gate electrode layer, the polysilicon layer 91 comprising the first conductive gate electrode layer, and gate terminal metallization 110 (FIG. 18) comprising a third conductive gate electrode layer. As described in greater detail in the above-incorporated Temple application Ser. No. 406,731, there are various forms which the second conductive gate electrode layer 106 may take, the preferred form, as depicted in FIG. 13, is a molybdenum silicide layer 106 in turn protected by a silicon nitride layer 108.

It should be noted that the layer 106, when included, has several advantages, but it is not essential. One advantage is a lower gate input impedance in the completed device structure. Another advantage, as may be seen with reference to FIG. 18, is that portions of the layer 106 remaining in the completed device 104 overhang the remainder of the gate electrode 70 structures, substantially aiding automatic separation of metallization into the gate terminal metallization 110 and source terminal metallization 112.

Alternatively, the conductive layer 106 may be omitted, and the protective silicon nitride layer 108 applied directly over the polysilicon gate electrode layer 91. The silicon nitride layer 108, in such event, protects the top of the polysilicon layer 91 from oxidation so that gate metallization 110 can be directly applied to top portions of the polysilicon gate electrode layer 91. In such event, however, there is no overhang, and automatic metallization separation is not as reliable. A light or a quick metal etch step is then required. Such a process is described, by way of example, in the above-identified Temple application Ser. No. 406,734.

Returning to the presently-illustrated process, FIG. 14 depicts an initial etching step, which comprises etching substantially vertically through the silicon nitride layer 108, the molybdenum silicide layer 106, and the polysilicon layer 91 to the gate insulating region layer 72. FIG. 14 is thus comparable to FIG. 3A, described above, except for the presence of the additional layers 106 and 108.

Next, with reference to FIG. 15, the P+ conductivity type shorting region 69 is formed by vertical ion implantation through the gate insulating region layer 72, in the same manner as described above with reference to either FIG. 4A or FIG. 10.

Next, as depicted in FIG. 16, previously un-etched portions of the polysilicon gate electrode layer 91 are laterally etched back to define insulated polysilicon gate electrode structures 70, as was described above with reference to FIG. 5A. Thus, the molybdenum silicide layer 106 and the protective nitride layer 108 are undercut. The resultant polysilicon gate electrode structures 70 are then employed as masks to form the device base and source regions 62 and 64.

In the particular process of FIGS. 13-18, these source and base regions 62 and 64 are formed by gas source diffusion, as in the alternative described hereinabove with reference to FIG. 12. Accordingly, to take advantage of the nitride layer 76 included in the gate insulating region layer 72 as a selective oxidation mask, in FIG. 16 the sidewalls of the polysilicon gate electrode structures 70 are selectively oxidized to form sidewall oxide 114 prior to removal of the gate insulating region layer 72 between the gate electrodes 70 and prior to source and base diffusion. The gate insulating region between the polysilicon gate electrodes 72 subsequently removed, as depicted in FIG. 17.

However, it will be appreciated that the source and base regions can be formed by ion implantation, as described above with reference to FIG. 6, and that this ion implantation can be accomplished through the gate insulating region layer 72 and can be done prior to selective oxidation to form the polysilicon gate electrode sidewall oxide 114. However, in this case, in view of the overhanging molybdenum silicide layer 106, the ion implantation to form the source and base regions 62 and 64 should be done at angles in order to cover the entire surface 66 of the drain region 56 between the polysilicon gate electrode structures 70, as is more particularly described in the above-referenced Temple application Ser. No. 406,731.

As described hereinabove, for removing the nitride 76 and oxide 74 and 78 (if still present) layers of the gate insulating region layer 72 between the gate electrode 70, selective etching techniques are employed. For example, buffered hydrofluoric acid is a suitable etchant for oxides, and hot phosphoric acid is a suitable etchant for nitride. Etching of the oxide layers 74 and 78 in the gate insulating region layer 72 is readily accomplished without removing the gate sidewall oxide layer 114 because the gate sidewall oxide layer 114 is much thicker. While some etching occurs, the layer 114 is not etched through.

Finally, if not removed by the previous etching steps, all mask and protective coatings over the molybdenum silicide layer 106 are removed. Preferably, the nitride layer 108 or other protective coating over the molybdenum silicide layer 106 is thicker than the nitride layer 76 within the gate insulating layer sandwich 72, but does not include any oxide thicker than the gate insulating oxide layer 74. As a result, silicon at the surface of the source region 62 (including the short region 69) is exposed, and upper portions of the molybdenum silicide layer portions 106 are also exposed.

At this point, to arrive at the ultimate structure depicted in FIG. 18, metal, such as aluminum, is deposited, such as by evaporation, onto the wafer so as to form metallized recessed source electrode terminals 112 in ohmic contact with the source region 62 and the shorting extension 69, and metallized gate layer terminals 110 in ohmic contact with the gate structure 70.

As mentioned above, this metallization is automatically separated into the higher region 110 comprising gate terminals, and the lower region 112 over the source region 62. During metallization, partial covering of the gate 70 sidewalls is not harmful due to the insulating oxide layer 114.

Drain contact metallization 58 is evaporated onto the substrate 60 at a convenient time to complete the device structure.

Although not specifically illustrated, in plan view the completed device of FIG. 18 preferably comprises a recessed comb-like structure comprising the source metallization 112, with individual source metallization fingers each connected at one of their ends to a common recessed source contact pad. A raised comb-like structure comprising gate metallization 110 is interdigitated with the recessed source metallization comb-like structure, with individual gate metallization fingers each connected at one of their ends to a common gate electrode facing the opposite direction with respect to the recessed source electrode.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A self-aligned process for manufacturing an insulated-gate semiconductor device including an integral short, said process comprising:

providing a semiconductor wafer including a first region of one conductivity type having a principal surface, and preparing the wafer by forming on the principal surface a gate insulating region layer, and forming on the gate insulating region layer a conductive gate electrode layer;

forming an etch resist mask having openings defining the ultimate locations of upper electrode regions, and initially etching in areas defined by the mask openings through the gate electrode layer at least to the gate insulating layer with minimal undercutting of the etch resist mask;

introducing into the first region impurities appropriate to form a shorting region of the opposite conductivity type while employing un-etched portions of the gate electrode layer as a mask;

laterally etching the previously un-etched portions of the gate electrode layer, thereby defining gate electrodes extending upwardly from and spaced along the gate insulating layer and first region principal surface;

introducing into the first region between the gate electrodes impurities appropriate to form a base region of opposite conductivity type and an upper electrode region of the one conductivity type within the base region, the gate electrodes serving as masks during the introduction of impurities, and diffusing the impurities introduced to appropriately locate and configure the base and upper electrode regions such that at the principal surface the base region exists as a band of opposite conductivity type between the upper electrode region and the first region, with active portions of the band underlying at least a portion of at least one gate electrode and being separated by portions of the gate insulating layer;

oxidizing at least the gate electrode sidewalls; and forming a metallized upper electrode region terminal in ohmic contact with the upper electrode and shorting regions, and forming a metallized gate terminal in ohmic contact with the gate electrode.

2. A process in accordance with claim 1, wherein the step of introducing impurities into the first region appropriate to form a shorting region comprises ion implantation.

3. A process in accordance with claim 2, wherein the ion implantation of shorting region impurities is carried out prior to removal of the gate insulating region layer, and the ion implantation is through the gate insulating layer.

4. A process in accordance with claim 1, wherein the steps of introducing base region and upper electrode region impurities comprise ion implantation.

5. A process in accordance with claim 4, wherein the steps of ion implantation are carried out prior to removal of the gate insulating region layer, and the ion implantation is through the gate insulating layer.

6. A process in accordance with claim 4, wherein at least the step of introducing base region impurities follows the step of removing the gate insulating layer between adjacent gate electrodes and comprises gas source diffusion.

7. A process in accordance with claim 4, wherein the step of introducing base region and upper region impurities follows the step of removing the gate insulating layer between adjacent gate electrodes and comprises gas source diffusion.

8. A process in accordance with claim 1, wherein:

the step of preparing the wafer includes, subsequent to forming a conductive gate electrode layer, forming on the gate electrode layer a layer of a refractory metal silicide such that the refractory metal silicide forms a part of the ultimate gate electrode; and wherein during the step of oxidizing the gate electrode sidewalls, at least the exposed side surfaces of the refractory metal silicide portions of the gate electrode are oxidized.

9. A process in accordance with claim 8, wherein the steps of introducing base region and upper region impurities comprise ion implantation.

10. A process in accordance with claim 8, wherein the steps of ion implantation are carried out prior to removal of the gate insulating region layer, and the ion implantation is through the gate insulating layer.

11. A process in accordance with claim 8, wherein at least the step of introducing base region impurities follows the step of removing the gate insulating layer between adjacent gate electrodes and comprises gas source diffusion.

12. A process in accordance with claim 8, wherein the step of introducing base region and upper electrode region impurities follows the step of removing the gate insulating layer between adjacent gate electrodes and comprises gas source diffusion.

* * * * *